United States Patent
Hashizume

[11] Patent Number: 5,946,556
[45] Date of Patent: Aug. 31, 1999

[54] FABRICATION METHOD OF PLASTIC-PACKAGED SEMICONDUCTOR DEVICE

[75] Inventor: Shozi Hashizume, Tokyo, Japan

[73] Assignee: NEC Corporation, Tokyo, Japan

[21] Appl. No.: 09/228,240

[22] Filed: Jan. 11, 1999

[30] Foreign Application Priority Data

Jan. 9, 1998 [JP] Japan .................................. 10-003526

[51] Int. Cl.⁶ .................................................. H01L 21/44
[52] U.S. Cl. ........................... 438/126; 438/124; 438/127
[58] Field of Search .................... 438/124, 125, 438/126, 127; 257/687, 788, 789, 790, 795

[56] References Cited

U.S. PATENT DOCUMENTS

| | | | |
|---|---|---|---|
| 4,942,456 | 7/1990 | Sako | 257/687 |
| 5,083,193 | 1/1992 | Heitzler et al. | 257/786 |
| 5,130,889 | 7/1992 | Hamburgen et al. | 257/687 |
| 5,304,512 | 4/1994 | Arai et al. | 438/124 |
| 5,362,679 | 11/1994 | Wakefield | 438/123 |
| 5,610,443 | 3/1997 | Inagaki et al. | 438/127 |
| 5,729,050 | 3/1998 | Kim | 257/687 |

FOREIGN PATENT DOCUMENTS

| | | |
|---|---|---|
| 45-22384 | 7/1970 | Japan . |
| 61-166138 | 7/1986 | Japan . |
| 64-71138 | 3/1989 | Japan . |
| 6-283619 | 10/1994 | Japan . |

*Primary Examiner*—Kevin M. Picardat
*Attorney, Agent, or Firm*—Sughrue, Mion, Zinn, Macpeak & Seas, PLLC

[57] ABSTRACT

A fabrication method of a plastic-packaged semiconductor device is provided, which prevents the high-frequency characteristics of a semiconductor element chip from degrading without complicating a package configuration. In the first step, a wax with a property of being solid at room temperature (e.g. paraffin wax) is melted due to heat and coated to cover bonding terminals of a semiconductor element chip, thereby forming a wax layer at a location where a cavity is formed. In the second step, the wax layer and the chip are covered with a liquid-like thermosetting packaging resin produced by dissolution in a solvent. In the third step, the packaging resin covering the wax layer and the chip is cured to form a plastic package and at the same time, the wax layer is melted to penetrate into the package due to application of heat at a first temperature, thereby forming the cavity inside the package at the location where the wax layer has been formed. The melted wax layer is discharged from the cavity through micro pores produced in the package, and almost all the pores are closed by the wax. In the fourth step, a residue of the wax layer left in the cavity is vaporized due to application of heat at a second temperature, thereby removing the residue of the wax layer from the cavity. The remaining unclosed pores of the package are closed by the residue of the wax layer.

11 Claims, 7 Drawing Sheets

5,946,556

FABRICATION METHOD OF PLASTIC-PACKAGED SEMICONDUCTOR DEVICE

BACKGROUND OF THE INVENTION

1. Field of the Invention

The present invention relates to a fabrication method of a plastic-packaged semiconductor device and more particularly, to a fabrication method of a semiconductor device equipped with a semiconductor element chip such as an Integrated Circuit (IC) chip and a plastic package for protecting the chip, in which the package has a cavity near bonding pads or connecting terminals of the chip.

2. Description of the Prior Art

In general, microwave semiconductor elements, which are typically formed as IC chips, are designed to operate in the microwave band covering the high frequency region from approximately 1 GHz to 1000 GHz.

It has been known that the electrical characteristics of the microwave semiconductor element tend to degrade due to the parasitic capacitance caused by a dielectric (e.g., synthetic resin or ionic impurity) existing near the bonding pads or connecting terminals of the element or IC chip. Therefore, the microwave semiconductor element chip needs to be packaged in such a way that a hollow cavity is formed in the vicinity of the bonding pads inside the plastic package, thereby removing selectively the packaging plastic material from the vicinity of the bonding pads.

To cope with this need, a plastic package structure as shown in FIGS. 1 and 2 have been usually used.

As shown in FIGS. 1 and 2, a plastic-packaged semiconductor device 101 with the conventional package structure is comprised of a supporting member 102 made of a synthetic resin or plastic. This member 102 has an approximately cylindrical shape whose top face is depressed. The member 102 supports a die pad or land 103 and four lead fingers 104. The die pad 103 and the lead fingers 104 are fixed by the member 102 to have a specific positional relationship. Each of the die pad 103 and the lead fingers 104 is made of conductive metal. The member 102 is joined and bonded at a joining/sealing portion 109 to a cylindrical cap 107 having an approximately cylindrical shape whose bottom face is depressed. The cap 107 is made of a synthetic resin or plastic.

The cap 107 constitutes a plastic package of the conventional semiconductor device 101. The depression at the top of the supporting member 102 and the depression at the bottom of the cap 107 are coupled together to form a hollow cavity 108 within the cap 107 (i.e., the plastic package).

The joining and sealing of the cap 107 to the supporting member 102 are carried out by the use of a thermosetting epoxy resin, a thermoplastic resin, or the like. Each of the supporting member 102 and the cap 107 is typically made of a thermosetting epoxy resin.

A microwave semiconductor element chip (i.e., a microwave IC chip) 105 is fixed onto the surface of the die pad 103 using a suitable adhesive material. The bonding pads (not shown) of the chip 105 formed at its surface are electrically connected to the inner ends of the corresponding lead fingers 104 through bonding wires 106. The microwave IC chip 105 and the bonding wires 106 are located in the cavity 108 of the cap 107 serving as the plastic package.

As seen from FIG. 1, two ones of the lead fingers 104 are arranged along a diameter of the supporting member 102, and the remaining two ones of the lead fingers 104 are arranged along another diameter of the member 102 perpendicular thereto. Inner portions of the four lead fingers 104, which are located inside the member 102, constitute inner leads. Outer portions of the four lead fingers 104, which are located outside the member 102, constitute outer leads.

The outer leads protruding from the supporting member 102 are produced by cutting and separating them from a lead frame (not shown) at end portions 104a, and by bending them at bending portions 104b and 104c to have a shape shown in FIGS. 1 and 2.

The conventional plastic-packaged semiconductor device 101 shown in FIGS. 1 and 2 is fabricated in the following way.

First, by a known injection molding method or the like, a thermosetting epoxy resin is molded to have an approximately cylindrical shape at the specific location of the lead frame, thereby forming the supporting member 102 that supports the die pad 103 and the lead fingers 104 of the lead frame in the manner shown in FIGS. 1 and 2.

Next, without separating the die pad 103 and the lead fingers 104 from the lead frame, the microwave IC chip 105 is fixed onto the surface of the die pad 103 using a specific adhesive material. Then, the bonding pads of the chip 103 and the inner ends of the lead fingers 104 are respectively bonded together through the bonding wires 106, thereby electrically connecting the bonding pads of the chip 103 to the respective lead fingers 104. Thereafter, the cap 107 is mechanically connected to the supporting member 102 at the joining/sealing portion 109 under heat, thereby sealing the IC chip 105 from its outside.

Finally, the lead fingers 104 are cut at the positions 104a to be separated from the lead frame and then, the outer leads are bent at the positions 104b and 104c to have the shape shown in FIGS. 1 and 2. Thus, the conventional semiconductor device 101 with the package structure shown in FIGS. 1 and 2 is fabricated.

Other known fabrication methods of the semiconductor devices or high-frequency circuit elements of this sort will be explained below.

The Japanese Examined Patent Publication No. 45-22384 published in July 1970 discloses a fabrication method of a ceramic filter of the energy confinement type. In this method, after an energy-confinement type resonator is formed on a piezoelectric ceramic plate, a film is formed on the electrodes of the resonator with a material which is solid or semisolid at room temperature (15° C.) and which is able to be melted under heat. Next, an insulating resin layer is formed to cover the solid or semisolid film by a dipping or molding method. During or after the formation of the insulating resin layer, the solid or semisolid film is melted due to heat and is absorbed into the insulating resin layer, thereby forming a cavity or gap at a location over the electrodes of the resonator within the insulating resin layer serving as a plastic package.

As the material which is solid or semisolid at room temperature and which is able to be melted under heat, the Japanese Examined Patent Publication No. 45-22384 discloses a paraffin or wax.

The Japanese Non-Examined Patent Publication No. 61-166138 published in July 1986 discloses a fabrication method of a semiconductor device, in which a semiconductor element chip is encapsulated by the use of a liquid resin along with an expanding or foaming agent such as dry ice and then, the resin is cured due to application of heat. After the expanding or foaming agent such as dry ice is placed on the surface of the chip, the chip and the agent are molded by the resin using a molding die. Due to the heat applied during the molding process, the resin is cured and at the same time, the agent is vaporized to be expanded, thereby forming a cavity of the package near the surface of the chip.

Light or vibration may be applied for curing the liquid resin instead of heat.

The Japanese Non-Examined Patent Publication No. 64-71138 published in March 1969 discloses a fabrication method of a plastic-packaged semiconductor device. In this method, after a surface-wave moving element is located between a transmitting electrode and a receiving electrode arranged apart from one another on the surface of an insulating substrate, a molten wax is coated to cover the whole surface of the substrate. Next, a porous resin film is formed to cover the film-shaped solid wax thus formed. The film-shaped solid wax and the porous resin film are reheated under a reduced pressure so that the solid wax is melted again and the melted wax is vaporized through the porous resin film, thereby forming a cavity between the element and porous resin film. Subsequently, the porous resin film is covered with a packaging or sealing plastic by a transfer molding method.

The Japanese Non-Examined Patent Publication No. 6-283619 published in October 1994 discloses a fabrication method of a semiconductor device. In this method, after a composite element including at least one elastic surface-wave element is provided on the surface of a substrate, a cavity-forming material is coated to cover the at least one elastic surface-wave element. Then, the surface of the substrate is covered with a porous elastic surface-wave absorption material. Subsequently, the cavity-forming material is heated to be vaporized, thereby forming a cavity in an encapsulating plastic package.

As the cavity-forming material, the Japanese Non-Examined Patent Publication No. 6-283619 discloses poly α-methyl styrene with a low ceiling temperature at which this material is completely vaporized, polyisobutylene or polymethacrylonitrile with a low decomposition temperature, or a mixture of waxes.

The above-described conventional semiconductor device 101 shown in FIGS. 1 and 2 has the following problems.

A first problem is that the fabrication cost is high because the cap 107 with the specific shape is necessary to be formed in advance.

This problem becomes remarkable if the miniaturization of the plastic package progresses further, which is because the positioning of the cap 107 needs to be precisely controlled using a special control system in the joining or bonding process of the cap 107 to the supporting member 102.

A second problem is that the reliability of the semiconductor device 101 is degraded.

Since a thermoplastic or thermosetting resin is used as the adhesive material for joining the cap 107 to the supporting member 102, heat needs to be applied during the joining process of the cap 107. Therefore, an air or gas confined in the cavity 108 of the package is expanded during the joining process.

On the other hand, the expanded air or gas in the cavity 108 gradually shrinks according to the lowering of the ambient temperature. As a result, a pressure difference is generated between the air or gas confined in the cavity 108 and the atmospheric air existing outside the package.

This pressure difference tends to cause a blowing-out phenomenon of the confined air or gas in the cavity 108 toward the outside or a sucking-in phenomenon of the atmospheric air toward the cavity 108, thereby forming penetrating pores in the adhesive material layer formed at the joining/sealing portion 109. The penetrating pores thus formed allow a soldering flux used in the mounting process of the semiconductor device 101 onto a printed wiring board and/or the atmospheric air existing in an operating environment of the device 101 to enter the inside of the plastic package, which degrades the reliability of the device 101.

A third problem is that moisture existing in an operating environment of the device 101 is likely to enter the inside of the plastic package through the cap 107 itself if the cap 107 becomes thinner according to the progressing device miniaturization.

With the above-described conventional fabrication methods disclosed in the Japanese Examined Patent Publication No. 45-22384, and the Japanese Non-Examined Patent Publication Nos. 61-166138, 64-71138, and 6-283619, the above-described first to third problems do not occur because any cap as shown in FIGS. 1 and 2 is not used. However, these conventional methods have the following problems.

With the conventional fabrication method disclosed in the Japanese Examined Patent Publication No. 45-22384, to form the cavity in the package, the film made of paraffin or wax is melted due to heat and then, the paraffin or wax film thus melted is removed by causing the melted film to be absorbed into the insulating resin film.

However, the melted paraffin or wax film is difficult to be removed completely and as a result, some residue of the paraffin or wax tends to be left on the surface of the resonator near the electrodes. This is because the resonator has small surface irregularity in the vicinity of the electrodes. Especially, the residue is readily left in the inter-electrode surface recesses of the resonator.

Since it has been known that the paraffin or wax residue damages or degrades the high-frequency characteristics of the resonator, the conventional method disclosed in the Japanese Examined Patent Publication No. 45-22384 has not been actually used in popular.

With the conventional fabrication method disclosed in the Japanese Non-Examined Patent Publication No 61-166138, dry ice is clearly disclosed as the expanding or foaming agent However, since dry ice vaporizes at an extremely high rate at room temperature, the amount and the temperature of the expanding or foaming agent are difficult to be controlled. As a consequence, it is extremely difficult to stably form the hollow cavity with a desired shape and a desired size at a desired position of the plastic package.

Additionally, since dry ice is solid at room temperature and has no wettability to the surface of the IC chip, the dry ice is likely to shift from its desired position during the molding process of the plastic package. This point increases the difficulty in formation of the cavity.

No other example than dry ice is disclosed in the Japanese Non-Examined Patent Publication No. 61-166138 as the expanding or foaming agent.

With the conventional fabrication method disclosed in the Japanese Non-Examined Patent Publication No. 64-71138, after the melted wax is coated and cooled to thereby form the wax layer, the porous resin film is formed to cover the wax layer. Thereafter, the wax layer is reheated under the reduced pressure to be melted. The melted wax layer is then vaporized through the porous resin film, thereby forming the cavity between the element and the porous resin film.

Therefore, it is essential for the resin film to be porous and accordingly, the packaging plastic is essentially formed to cover the porous resin film. If the packaging plastic is not used, the "moisture resistance" property of the plastic-packaged semiconductor device will degrade.

As explained above, with the conventional fabrication method disclosed in the Japanese Non-Examined Patent Publication No. 64-71138, both of the porous resin film and the packaging plastic need to be stacked in addition to the wax film. Therefore, the configuration of the plastic package becomes complicated.

With the conventional fabrication method disclosed in the Japanese Non-Examined Patent Publication No. 6-283619, after the cavity-forming material is coated to cover the at least one elastic surface-wave element, the whole surface of the substrate is covered with the porous elastic surface-wave absorbing material. Subsequently, the cavity is formed in the inside of the plastic package by heating and vaporizing the cavity-forming material.

Therefore, it is necessary to use a material with a low ceiling temperature or decomposition temperature as the cavity-forming material. This means that only limited materials can be used to form the plastic package.

SUMMARY OF THE INVENTION

Accordingly, an object of the present invention to provide a fabrication method of a plastic-packaged semiconductor device that makes it possible to prevent the high-frequency characteristics of a semiconductor element chip from degrading without complicating a package configuration.

Another object of the present invention is to provide a fabrication method of a plastic-packaged semiconductor device in which a material with a desired property can be selected for a plastic package from a comparatively wide range of materials as necessary.

Still another object of the present invention is to provide a fabrication method of a plastic-packaged semiconductor device that enables the production of a semiconductor device with good high-frequency characteristics and high reliability even if the device miniaturization progresses further.

The above objects together with others not specifically mentioned will become clear to those skilled in the art from the following description.

A fabrication method of a semiconductor device according to the present invention is comprised of the following first to fourth steps.

In the first step, a wax with a property of being solid at room temperature is melted due to heat and the melted wax is coated to cover connecting terminals or electrodes of a semiconductor element chip, thereby forming a wax layer at a location where a cavity is formed.

In the second step, the wax layer and the chip are covered with a liquid-like thermosetting packaging resin produced by dissolution in a solvent.

In the third step, the packaging resin covering the wax layer and the chip is cured to form a plastic package and at the same time, the wax layer is melted to penetrate into the plastic package due to application of heat at a first temperature, thereby forming the cavity inside the plastic package by elimination of the wax layer at the location where the wax layer has been formed.

In the fourth step, a residue of the wax layer left in the cavity is vaporized due to application of heat at a second temperature, thereby removing the residue of the wax layer from the cavity.

With the fabrication method of a semiconductor device according to the present invention, due to the application of heat at the first temperature in the third step, the packaging resin covering the wax layer and the chip is cured to form the plastic package and at the same time as this, the wax layer is melted to penetrate into the plastic package, thereby forming the cavity inside the plastic package by elimination of the wax layer at the location where the wax layer has been formed.

Almost all the micro pores of the plastic package, which are produced by vaporization of the wax layer during the third step, are closed by absorption of the wax layer through the third step. The unclosed micro pores of the plastic package are closed by absorption of the residue of the wax layer through the fourth step.

As a result, there is no need to additionally cover the plastic package with a peculiar or unusual resin. Accordingly, the high-frequency characteristics of the semiconductor element chip is able to be prevented from degrading without complicating the configuration of the plastic package.

Also, after the packaging resin covering the wax layer and the chip is cured by heating at the first temperature to form the plastic package in the third step, the packaging resin is reheated at the second temperature in the fourth step to vaporize the residue of the wax layer left in the cavity of the package, thereby removing the residue from the cavity. Therefore, it is unnecessary for the wax layer to have a low ceiling temperature. This means that a material with a desired property can be selected for the plastic package from a comparatively wide range of materials as necessary.

Moreover, after the packaging resin covering the wax layer and the chip is cured by heating at the first temperature to form the plastic package in the third step, the packaging resin is reheated at the second temperature in the fourth step to vaporize the residue of the wax layer left in the cavity of the package, thereby removing the residue from the cavity. Therefore, the residue of the wax layer is able to be removed almost completely.

Accordingly, in cooperation with the fact that the high-frequency characteristics of the semiconductor element chip is able to be prevented from degrading without complicating the configuration of the plastic package and that a material with a desired property can be selected for the plastic package from a comparatively wide range of materials as necessary, the production of a plastic-packaged semiconductor device with good high-frequency characteristics and high reliability is enabled even if the device miniaturization progresses further.

The reason why almost all the wax layer is removed in the third step is as follows.

The solvent contained in the thermosetting packaging resin used in the second step is vaporized due to heat in the third step. Since the vaporized solvent is discharged to the outside through the coated packaging resin which is in a curing process, micro pores are formed in the plastic package. The melted wax due to heat in the third step penetrates into these micro pores due to the capillarity phenomenon. In other words, since the melted wax is impregnated into the micro pores, almost all the micro pores are filled or closed. Thus, almost all the wax layer is removed.

However, all the wax layer is not removed in the third step. This is because surface irregularities with a depth of several or several tens micrometers exist on the surface of the IC chip in near the bonding pads or connecting terminals and accordingly, it is inevitable for the wax to be slightly left at the recesses and/or corners of the irregular surface as the residue.

In the fourth step, to remove the residue of the wax layer left in the cavity of the packager the residue is vaporized due to application of heat at the second temperature. The vaporized residue of the wax layer is discharged to the outside of the package through the unfilled or unclosed pores of the plastic package. Thus, the residue is removed almost completely from the cavity.

The size of the micro pores formed in the plastic package is optional. It is sufficient for the pores to allow the melted wax layer to be discharged and to be filled with the melted wax as if the melted wax layer is impregnated into the pores.

In a preferred embodiment of the method according to the present invention, the solvent of the liquid-like thermosetting packaging resin has a content of 5.0 to 1.0 wt %.

If the content of the solvent is greater than 5.0 wt %, unwanted large pores are likely to be formed in the plastic package due to rapid vaporization of the solvent, where the large pores are unable to be completely filled with the melted wax layer. Therefore, a soldering flux, water or moisture, and/or ionic impurities existing in the atmospheric air tend to enter the cavity of the package in a subsequent mounting process of the semiconductor device onto a suitable substrate or an operating environment thereof. Thus, there arises a high possibility that the reliability of the semiconductor device is damaged or degraded.

If the content of the solvent is less than 1.0 wt %, the number of the micro pores of the package is excessively decreased. Therefore, the melted wax layer is unable to sufficiently penetrate into the package, in other words, the amount of the residue of the wax layer becomes large. Thus, the residue is likely to be left in the cavity of the package near the bonding pads or connecting terminals of the chip even after the fourth step. The unwanted remaining residue degrades the high-frequency characteristics of the chip.

In another preferred embodiment of the method according to the present invention, the first temperature is higher than a temperature at which the liquid-like thermosetting packaging resin starts to cure and higher than a melting point of the wax layer. In this case, the advantages of the present invention are ensured.

In still another preferred embodiment of the method according to the present invention, the second temperature is higher than a temperature at which at least 95 wt % of the wax layer left in the cavity is vaporized and lower than a temperature at which characteristics of the chip start to degrade. In this case, the advantages of the present invention are ensured.

The reason why at least 95 wt % of the wax left in the cavity is vaporized is that almost all the wax layer is able to be removed without constituting any obstacle, if at least 95 wt % of the wax layer is vaporized.

The temperature at which at least 95 wt % of the wax layer left in the cavity is vaporized is a temperature obtained by a measurement while only the wax layer is placed in the atmospheric air or a nitrogen ($N_2$) atmosphere.

In a further preferred embodiment of the method according to the present invention, the semiconductor device is comprised of a plastic supporting member that supports a die pad and lead fingers. The chip is mounted onto the die pad and electrically connected to the lead fingers prior to the first step. The packaging resin is fixed onto the supporting member to cover the chip in the second step. In this case, there is an additional advantage that this method is applicable to fabrication of a semiconductor device equipped with outer leads protruding from the plastic package and/or the supporting member.

In a still further preferred embodiment of the method according to the present invention, the semiconductor device is comprised of a substrate having a conductive pattern on its surface. The chip is mounted onto the substrate and electrically connected to the conductive pattern prior to the first step. The packaging resin is fixed onto the substrate to cover the chip in the second step. In this case, there is an additional advantage that this method is applicable to fabrication of a so-called "hybrid IC".

In a still further preferred embodiment of the method according to the present invention, a paraffin wax is used as the wax. This is because a paraffin wax has an optimum melting property and an optimum vaporizing property.

In a still further preferred embodiment of the method according to the present invention, at least one of the first and second temperatures is adjusted by changing an average molecular weight of the wax. In this embodiment, there is an additional advantage that the melting property and the vaporizing property of the wax are readily determined as desired.

It is preferred that the second temperature is not greater than a thermal decomposition temperature (e.g., approximately 380° C. for the thermosetting resin) of the packaging resin or the supporting member, and the second temperature is not greater than a performance degradation temperature (e.g., approximately 380° C. for the GaAs-system elements and approximately 450° C. for Si-system elements) of the chip.

If the second temperature is greater than the thermal decomposition temperature, the thermosetting resin and/or supporting member tends to be thermally decomposed and as a result, a decomposition product tends to be adhered onto the surface of the chip, which may form a cause of degradation in the characteristics of the semiconductor device or lowering in the supporting strength of the member.

If the second temperature is greater than the performance degradation temperature, the characteristics or performance of the semiconductor device itself is degraded due to degradation of the chip.

In the method according to the present invention, any type of semiconductor element chips may be used as the chip.

A paraffin wax is preferably used in the method according to the present invention. However, any other wax may be used for this purpose if it satisfies the conditions described in the above-described first to fourth steps.

Any thermosetting resin may be used for the packaging resin if it has a desired property. Any solvent may be used for the solvent of the packaging resin if it generates the liquid-like thermosetting packaging resin with a desired property.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Figure 1:
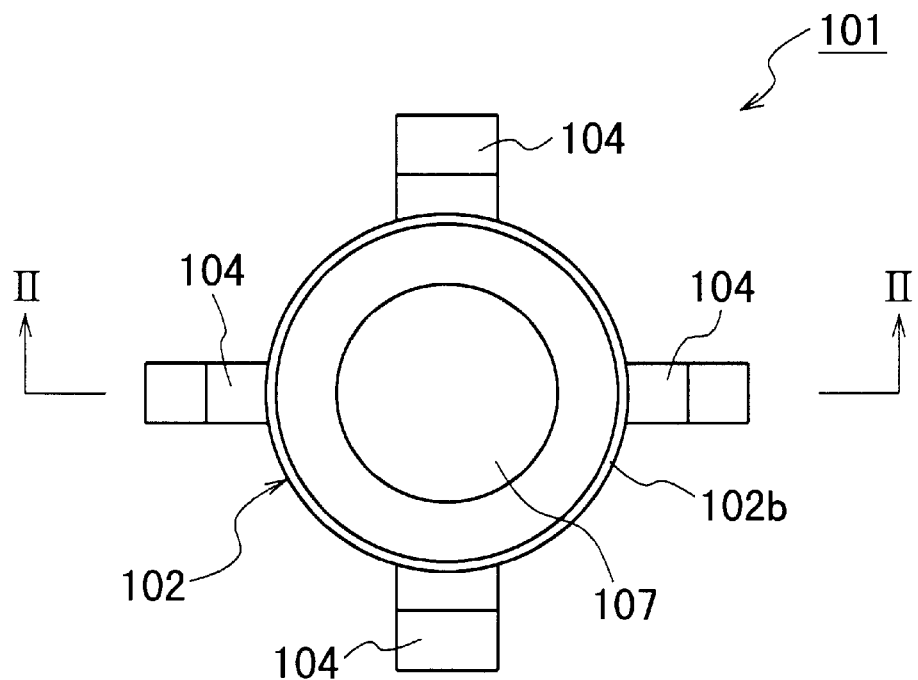
FIG. 1 is a schematic plan view showing the structure of a conventional plastic-packaged semiconductor device fabricated by a conventional method.

Preferred embodiments of the present invention will be described in detail below while referring to the drawings attached.

First Embodiment

Figure 3:
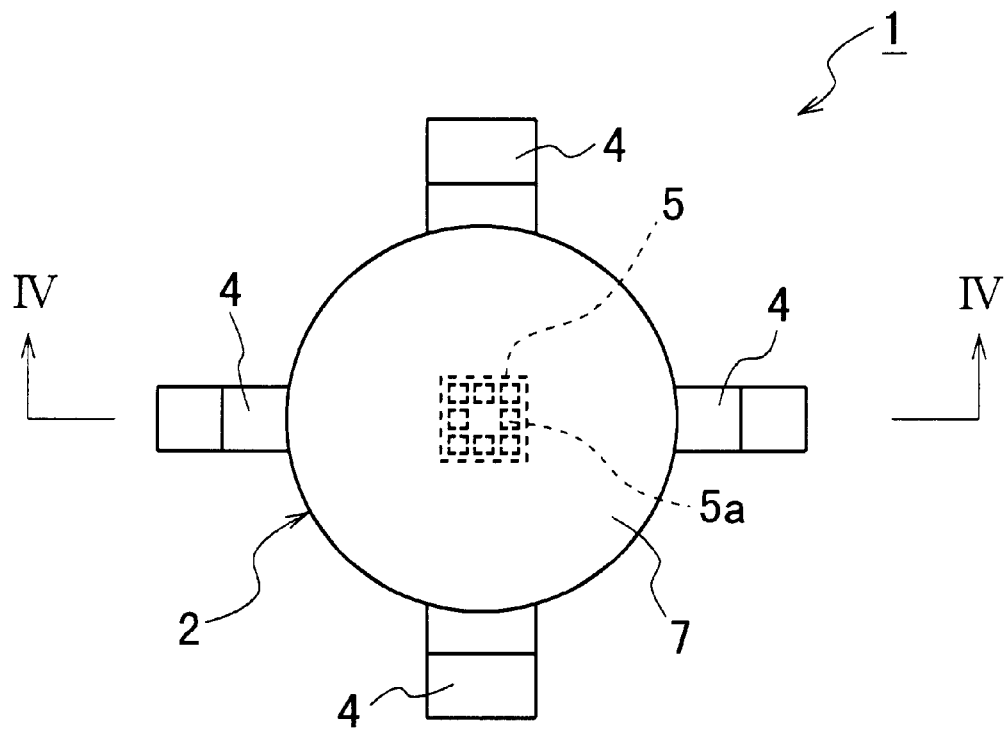
FIG. 3 is a schematic plan view showing the structure of a plastic-packaged semiconductor device fabricated by a method according to a first embodiment of the present invention.
Figure 4:
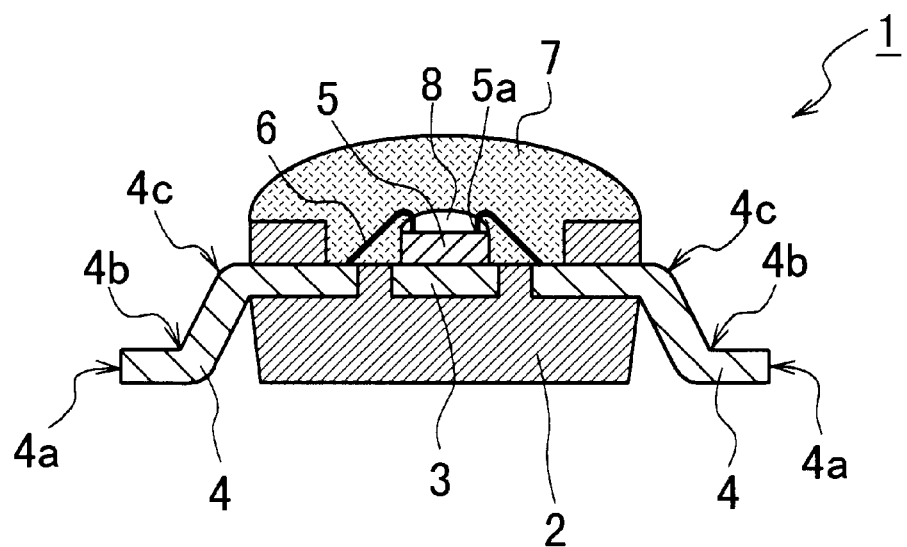
FIG. 4 is a cross-sectional view of the semiconductor device, which is along the line IV—IV in FIG. 3.

A plastic-packaged semiconductor device fabricated by a method according to a first embodiment of the present invention has a structure as shown in FIGS. 3 and 4.

Configuration

As shown in FIGS. 3 and 4, a semiconductor device 1 is comprised of a supporting member 2 made of a thermosetting epoxy resin. This member 2, which has an approximately cylindrical shape whose top face is depressed, supports a die pad or land 3 and four lead fingers 4. Each of the die pad 3 and the lead fingers 4 is made of a copper (Cu)-system alloy. The die pad 3 and the lead fingers 4 are fixed by the member 2 to have a specific positional relationship. To match the thermal expansion coefficient of the thermosetting epoxy resin used for the member 2 to the thermal expansion coefficients of the die pad 3 and the lead fingers 4, a suitable amount of a powder of ceramic such as silica ($SiO_2$) is added to the epoxy resin.

A microwave semiconductor element chip or microwave IC chip 5 is fixed onto the surface of the die pad 3 using a suitable adhesive material such as a gold/tin (Au/Sn) alloy or a silver (Ag) paste. Bonding pads or connecting terminals 5a are formed at the surface of the chip 5. As seen from FIG. 3, these bonding pads 5a are arranged at intervals in the peripheral area of the surface of the chip 5 along its four edges. The ends of bonding wires 6 are bonded to the individual bonding pads 5a of the chip 5 and the opposite ends thereof are bonded to the inner ends of the individual lead fingers 4. Thus, the pads 5a are electrically connected to the corresponding lead fingers 4 through the bonding wires 6, respectively. The bonding wires 6 are made of gold (Au).

The upper surface of the supporting member 2 is covered with a plastic cover or lid 7 made of a thermosetting epoxy resin, thereby sealing the IC chip 5 and the bonding wires 6. The bottom of the cover 7 has a circular shape which is matched to the circular upper surface of the supporting member 2. The spherical upper surface of the cover 7 protrudes upward. To match the thermal expansion coefficient of the thermosetting epoxy resin used for the cover 7 to the thermal expansion coefficients of the die pad 3 and the lead fingers 4, a suitable amount of a powder of ceramic such as silica is added to the epoxy resin.

As shown in FIG. 4, a hollow cavity 8 is formed between the IC chip 5 and the cover 7 in the vicinity of the bonding pads 5a of the chip 5. The cavity 8 has an approximately rectangular plan shape, which corresponds to the rectangular plan shape of the chip 5. The cavity 8 is formed by forming a paraffin wax layer (not shown in FIG. 4) on the surface of the chip 5 and then, removing the paraffin wax layer after the formation of the plastic cover 7.

Figure 2:
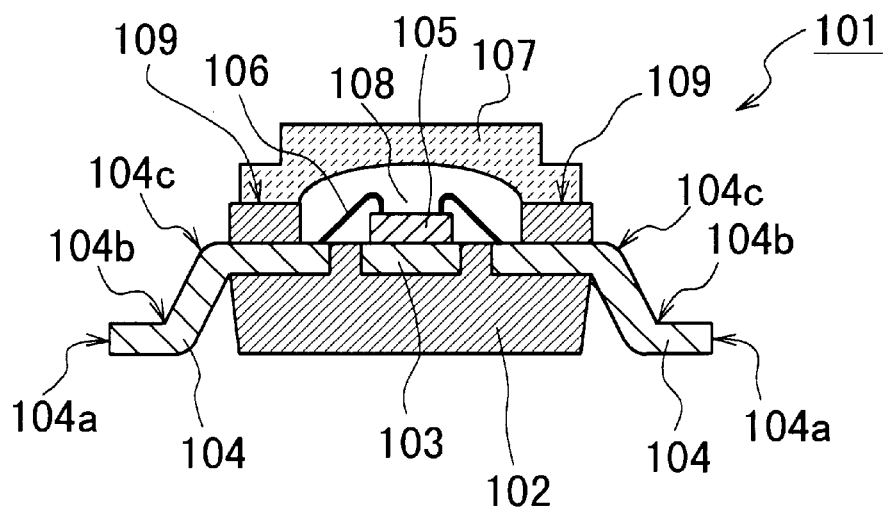
FIG. 2 is a cross-sectional view of the conventional semiconductor device, which is along the line II—II in FIG. 1.

Unlike the conventional semiconductor device 101 shown in FIGS. 1 and 2, the hollow cavity 8 is located only on the surface of the IC chip 5 while almost all the bonding wires 6 are outside the cavity 8.

The cover 7 constitutes a plastic package of the semiconductor device 1.

As seen from FIG. 1, two ones of the lead fingers 4 are arranged along a diameter of the supporting member 2, and the remaining two ones of the lead fingers 4 are arranged along another diameter of the supporting member 2 perpendicular thereto. Inner portions of the four lead fingers 4, which are located inside the supporting member 2, constitute inner leads. Outer portions of the four lead fingers 4, which are located outside the supporting member 2, constitute outer leads.

The outer leads protruding from the supporting member 2 are produced by cutting a lead frame (not shown) at end portions 4a and separating therefrom and then, by bending at bending portions 4b and 4c to have a shape shown in FIG. 4.

Although not shown, the surfaces of the die pad 3 and the lead fingers 4 are plated with a metal such as gold (Au) or silver (Ag). The plated metal is formed for the purpose of (i) facilitating the adhesion or fixing of the IC chip 5 to the die pad 3, (ii) bonding the bonding wires 6 to the lead fingers 4, and (iii) improving the wettability of a solder to the lead fingers 4 in a subsequent mounting process of the semiconductor device 1 onto a printed circuit board (PCB) (not shown).

Fabrication Method

The semiconductor device 1 with the configuration shown in FIGS. 3 and 4 is fabricated by using the fabrication method according to the first embodiment, which will be explained below with reference to FIGS. 5A to 5F.

Figure 5A:
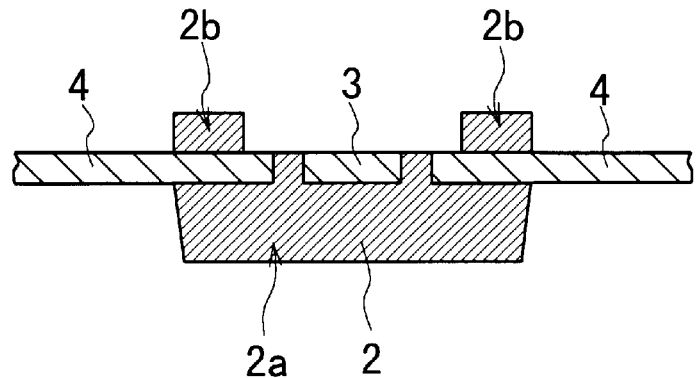
FIGS. 5A to 5F are cross-sectional views showing the process steps of the fabrication method according to the first embodiment of the present invention, respectively.

First, a thermosetting epoxy resin is molded by a known injection molding method or the like to have an approximately cylindrical shape at the specific location of the lead frame, thereby forming the supporting member 2 that supports the die pad 3 and the lead fingers 4. The state at this stage is shown in FIG. 5A.

As the thermosetting epoxy resin for the supporting member 2, a molten or fluidized thermosetting epoxy resin due to heat is used. The molten resin is injected into a heated molding die (not shown) and is cured by the heat existing in the molding die. For the purpose of matching the thermal expansion coefficients, the thermosetting epoxy resin contains a suitable amount of a powder of ceramic such as silica.

Figure 5B:
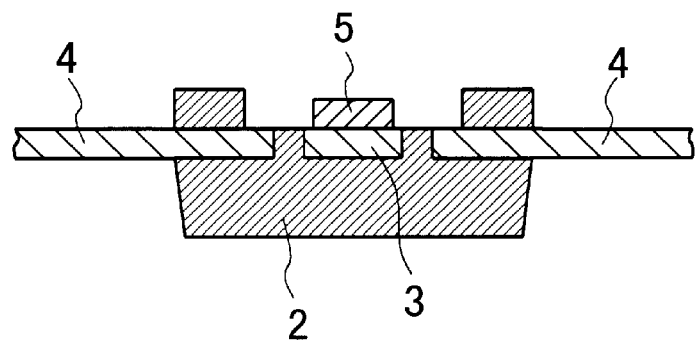
Figure 5C:
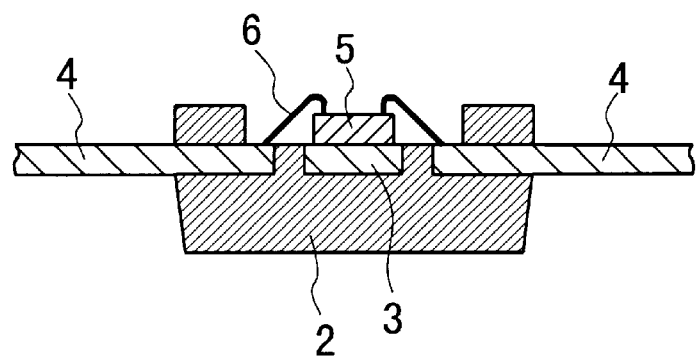

Next, without separating the die pad 3 and the lead fingers 4 from the lead frame, the microwave semiconductor element chip 5 is fixed onto the surface of the die pad 3 using the specific adhesive material, as shown in FIG. 5B. Then, the bonding pads 5a of the chip 5 and the inner ends of the lead fingers 4 are respectively bonded together through the bonding wires 6, thereby electrically connecting the bonding pads 5a of the chip 5 to the respective lead fingers 4, as shown in FIG. 5C. Thus, a subassembly of the semiconductor device 1 is completed.

The above-described process steps are the same as those in the conventional method used for fabricating the conventional semiconductor device 101 shown in FIGS. 1 and 2.

Figure 5D:
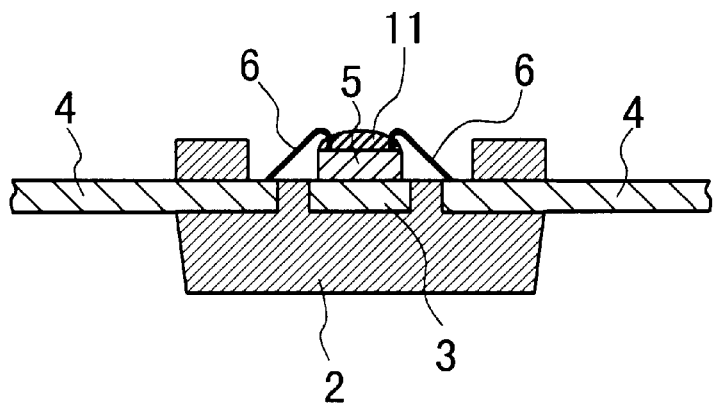

Subsequently, as shown in FIG. 5D, a paraffin wax layer 11 is selectively formed on the surface of the chip 5 fixed onto the die pad 3. The shape and size of the paraffin wax layer 11 are designed to be equal to those of the desired hollow cavity 8. To form the paraffin wax layer 11, a suitable paraffin wax, which is solid at room temperature (15° C.), is melted or fluidized by heating to a temperature slightly higher than the melting point of the paraffin wax (a first heating process). It is preferred that this heating temperature is higher than the melting point of the paraffin wax by approximately 10 to 30 degrees in centigrade. The paraffin wax thus fluidized is then coated onto the surface of the chip 5. The paraffin wax thus coated is then cooled down to room temperature for curing by a natural cooling method, resulting in the paraffin wax layer 11 shown in FIG. 5D.

Figure 5E:
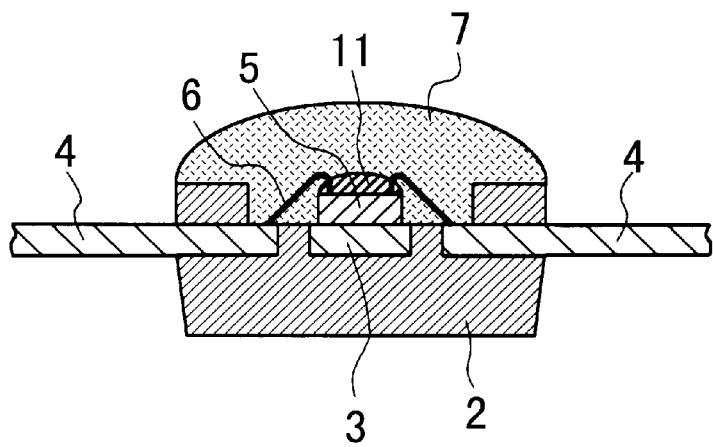

Thereafter, to form the plastic cover or lid 7 on the upper surface of the supporting member 2, a thermosetting epoxy resin, which is liquid at room temperature, is used as a packaging resin. Specifically, a specific amount of the liquid epoxy resin is placed onto the upper surface of the supporting member 2 at room temperature so as to cover the whole upper surface thereof by a dropping method, a screen printing method, or the like. The state at this stage is shown in FIG. 5E. The chip 5 and the bonding wires 6 are entirely covered with the liquid epoxy resin (i.e., the packaging resin) thus placed.

The liquid thermosetting packaging resin used for the plastic cover 7 is produced by dissolving a suitable thermosetting epoxy resin in a suitable solvent such as methyl ethyl ketone. For the purpose of matching the thermal expansion coefficients, the liquid epoxy resin contains a suitable amount of a powder of ceramic such as silica.

Further, the subassembly of the semiconductor device 1 having the liquid packaging resin on the supporting member 2 is reheated to a temperature which is equal to or higher than the cure starting temperature of the thermosetting epoxy resin and which is higher than the melting point of the paraffin wax layer 11 (a second heating process). This temperature is set as, for example, 150° C., according to the sort of the employed epoxy resin. This is because the thermosetting epoxy resin usually starts to cure at a temperature of 110 to 220° C.

Figure 5F:
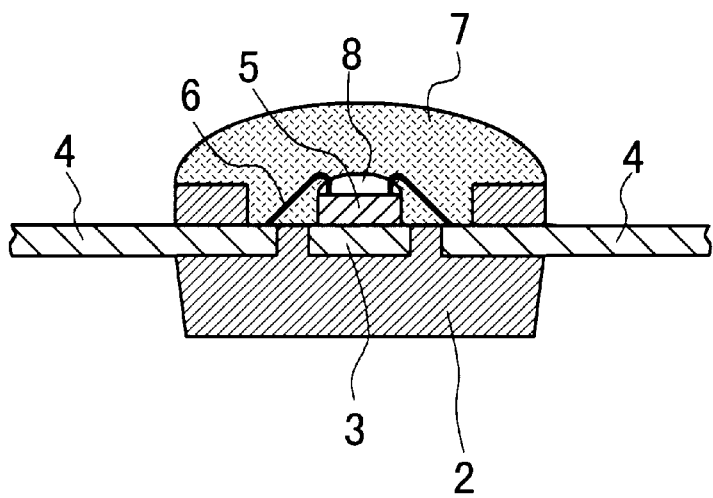

During this second heating process, as shown in FIG. 5F, the liquid epoxy resin (i.e., the packaging resin) placed on the supporting member 2 is cured, thereby forming the plastic cover or lid 7 with the shape as shown in FIGS. 3 and 4. Because of vaporization of the solvent of the liquid epoxy resin, micro pores are formed in the cover 7, in other words, the cover 7 becomes porous.

At the same time as this, the paraffin wax of the paraffin wax layer 11 is melted, and the melted paraffin wax penetrates into the micro pores produced in the cover 7 due to the capillarity phenomenon. Thus, the plastic cover 7 is turned to a state where the pores of the cover 7 are impregnated with the molten paraffin wax. As a result, through this heating process, almost all the paraffin wax layer 11 disappears and almost all the micro pores of the cover 7 are filled or closed with the molten paraffin wax.

All the paraffin wax layer 11 is not removed through the second heating process. A slight part of the paraffin wax of the layer 11 is likely to be left as a residue at the minute recesses of the surface of the chip 5 near the bonding pads 5a and/or the inner wall of the cover 7.

Thereafter, the subassembly of the semiconductor device 1 with the epoxy resin cover 7 is reheated to a temperature which is equal to or higher than the vaporization starting temperature of the paraffin wax of the paraffin wax layer 11. For example, this temperature is set as 250° C. Through this process, the residue of the remaining paraffin wax at the minute surface recesses of the semiconductor element chip 5 near the bonding pads 5a and/or the inner wall of the cover 7 is removed substantially completely. Thus, the hollow cavity 8 having substantially the same shape and size as those of the initial paraffin wax layer 11 is formed between the chip 5 and the cover 7. The state at this stage is shown in FIG. 5G.

The vapor of the paraffin wax residue is discharged to the outside of the cavity 8 through the remaining unfilled or unclosed micro pores of the plastic cover 7. At the same time as this, the unfilled or unclosed micro pores of the plastic cover 7 are closed by the paraffin wax residue thus discharged. As a result, the micro pores of the cover 7 are completely closed.

Finally, by known cutting and forming methods, the die pad 3 and the lead fingers 4 are separated from the lead frame using a pressing machine and then, the outer lead portions of the lead fingers 4 are bent as shown in FIG. 4. Thus, the semiconductor device 1 with the configuration shown in FIGS. 3 and 4, in which the semiconductor element chip 5 is encapsulated by the plastic cover 7 and the plastic supporting member 2, is fabricated.

As the thermosetting epoxy resin used in the above-explained fabrication method according to the first embodiment, for example, an epoxy resin termed the "SUMILITE RESIN PR-53365 (commercial name)" and produced by the Sumitomo Bakelite incorporated is preferably used.

If the liquid epoxy resin used for the cover 7 is cured in a constant-temperature reservoir which has been fixed at a temperature of 150° C., it is preferred that the solvent (e.g., methyl ethyl ketone) of the liquid epoxy resin has a content of 5.0 to 1.0 wt %. This content of the solvent in the liquid epoxy resin may be realized by leaving the liquid epoxy resin at room temperature or by applying a low-temperature drying process to the liquid epoxy resin.

If the content of the solvent is greater than 5.0 wt %, unwanted large pores tend to be formed in the cover 7 due to rapid vaporization of the solvent, where the large pores have a size which is unable to be completely filled with the melted wax. Therefore, a soldering flux, water or moisture, and/or ionic impurities existing in the atmospheric air tend to enter the cavity 8 of the cover 7 in a subsequent mounting process of the semiconductor device 1 onto a circuit board or in an operating environment thereof. Thus, there arises a high possibility that the reliability of the semiconductor device 1 is damaged or degraded.

If the content of the solvent is less than 1.0 wt %, the number of the micro pores of the cover 7 is excessively decreased and therefore, the melted wax is unable to sufficiently penetrate into the cover 7. In other words, the amount of the residue of the melted wax becomes large. Thus, the residue is likely to be left in the cavity 8 of the package near the bonding pads 5a of the IC chip 5 even after the vaporization process of the wax, which degrades the high-frequency characteristics of the chip 5.

It is preferred that the second temperature at which at least 95 wt % of the paraffin wax left in the cavity 8 is vaporized is not greater than the thermal decomposition temperature (approximately 380° C. for epoxy resin) of the cover 7 and the supporting member 2 nor than the performance degradation temperature (approximately 380° C. for GaAs-system elements, approximately 450° C. for Si-system elements) of the chip 5.

If the second temperature is greater than the thermal decomposition temperature of the cover 7 or the supporting member 2, the cover 7 and/or the supporting member 2 tends to be thermally decomposed and as a result, some decomposition product tends to be adhered onto the surface of the chip 5. The decomposition product will form a cause of degradation in the characteristics of the semiconductor device 1 or lowering in the supporting strength of the member 2.

If the second temperature is greater than the performance IC degradation temperature of the chip 5, it is needless to say that the characteristics or performance of the semiconductor device 1 itself is degraded due to performance degradation of the chip 5.

With the fabrication method of the semiconductor device 1 according to the first embodiment of the present invention, as described above, due to the application of heat at the specific temperature, the liquid packaging resin covering the paraffin wax layer 11 and the chip 5 is cured to form the plastic package 7 and at the same time as this, the paraffin wax layer 11 is melted to penetrate into the package 7, thereby forming the cavity 8 inside the package 7 by elimination of the wax layer 11 at the location where the wax layer 11 has been formed. Through this process, almost all the micro pores of the plastic package 7, which are produced by vaporization of the paraffin wax layer 11, are closed by absorption of the wax layer 11.

The remaining unclosed micro pores of the plastic package 7 are closed by absorption of the residue of the remaining paraffin wax in the subsequent heating process for removing the residue from the cavity 8.

As a result, there is no need to additionally cover the plastic package 7 with a peculiar or unusual resin. Accordingly, the high-frequency characteristics of the semiconductor element chip 5 is able to be prevented from degrading without complicating the configuration of the plastic package 7.

Also, after the liquid packaging epoxy resin covering the paraffin wax layer 11 and the chip 5 is cured by heating at the specific temperature to form the plastic package 7, the packaging epoxy resin is reheated at the different temperature to vaporize the residue of the wax layer 11 left in the cavity 8 of the package 7, thereby removing the residue from the cavity 8. Therefore, it is unnecessary for the wax layer 11 to have a low ceiling temperature. This means that a material with a desired property can be selected for the plastic package 7 from a comparatively wide range of materials as necessary.

Moreover, after the liquid packaging epoxy resin covering the paraffin wax layer 11 and the chip 5 is cured by heating at the specific temperature to form the plastic package 7, the packaging resin is reheated at the different temperature to vaporize the residue of the wax layer 11 left in the cavity 8 of the package 7, thereby removing the residue from the cavity 8. Therefore, the residue of the wax layer 11 is able to be removed almost completely.

Accordingly, in cooperation with the fact that the high-frequency characteristics of the semiconductor element chip 5 is able to be prevented from degrading without complicating the configuration of the plastic package 7 and that a material with a desired property can be selected for the plastic package 7 from a comparatively wide range of materials as necessary, the production of the plastic-packaged semiconductor device 1 with good high-frequency characteristics and high reliability is enabled even if the device miniaturization progresses further.

The heating process for curing the liquid packaging epoxy resin and melting the paraffin wax layer 11 and that for removing the residue of the paraffin wax may be carried out after placing the subassembly of the semiconductor device 1 in a constant-temperature reservoir or on a heater block.

Confirmation Tests

To confirm the advantages of the fabrication method according to the first embodiment, the inventor performed some tests in the following way. The result of the tests is listed in Table 2 shown below.

As the microwave semiconductor element chip 5, a microwave field-effect transistor chip made of a GaAs compound semiconductor (i.e., G GaAs FET chip) was used.

As the package structure, three types were used. Specifically, (i) the package structure of the semiconductor device 1 produced by the method according to the first embodiment, (ii) the conventional package structure of the semiconductor device 101 shown in FIGS. 1 and 2 which is produced by the conventional method, and (iii) the conventional package structure of the semiconductor device shown disclosed in the Japanese Examined Patent Publication No. 45-22384 were used.

To evaluated the characteristics or performance of the fabricated semiconductor devices, the noise figure (NF) characteristic at a measuring frequency of 12 GHz and the associated gain (Ga) at the minimum NF were measured.

As a reliability test, a pressure cooker test (PCT) was carried out under the following condition.

The plastic-packaged semiconductor devices were immersed into a popular soldering flux and then, they were immersed into a molten Pb/Sn eutectic solder held at a temperature of 240° C. for 5 seconds. Subsequently, they were boiled in a moisture vapor kept at a pressure of 2.3 atm. for 100 hours. Finally, the characteristics of the semiconductor devices were measured and compared with their characteristics prior to the PCT, thereby finding the deviation of the characteristics.

As the paraffin wax, four types A, B, C, and D listed in the following Table 1 were prepared and used. In Table 1, the "vaporization finishing temperature" means a temperature at which 95 wt % of each type of paraffin wax is vaporized when only the wax is heated in the atmospheric air.

TABLE 1

| Type of Paraffin Wax | Vaporization Finishing Temperature (° C.) | Melting Point (° C.) |
| --- | --- | --- |
| A | 440 | 113 |
| B | 455 | 95 |
| C | 365 | 75 |
| D | 285 | 57 |

In Table 1, the type A is a paraffin wax termed the "SUMILITE RESIN PR-53191D (commercial name)" produced by a Japanese company, the Sumitomo Bakelite Incorporated. This wax has a vaporization finishing temperature of approximately 440° C. and a melting point or melting temperature of approximately 113° C.

The type B is a paraffin wax produced by adding a suitable amount of the wax termed the "SUMILITE RESIN PR-53191D" having lower molecular sizes than those of the type A to the type A. Thus, the melting point is lowered to approximately 95° C. while the vaporization finishing temperature of approximately 440° C. of the type A is approximately unchanged (i.e., approximately 455° C.).

The type C is a paraffin wax produced by decreasing the high molecular-weight components of the type A to lower the average molecular weight of the type A itself. Thus, the vaporization finishing temperature of the type C is lowered to IC approximately 365° C. and the melting point thereof is lowered to approximately 75° C.

The type D is a paraffin wax produced by lowering the average molecular weight of the type C. Thus, the vaporization finishing temperature of the type D is further lowered to approximately 285° C. and the melting point thereof is further lowered to approximately 57° C.

The adjustment of the average molecular weight of the paraffin wax is able to be accomplished by a distillation method or a chemical synthesis method. In the case of the distillation method, the molecular weight of the paraffin wax can be controlled or changed by the use of the fractional distillation process in different temperature ranges. For example, the high molecular-weight components will decrease if the paraffin wax is distilled at a high temperature. Also, the average molecular weight will decrease if the distillation temperature is lowered.

TABLE 2

| Eval. No. | Wax Type | Class | Vaporization Condition | NF (dB) | Ga (dB) | PCT (failure/ total) |
|---|---|---|---|---|---|---|
| I | — | Prior Art 1 | None | 0.45 | 12.6 | 6/20 |
| II | A | Prior Art 2 | None | 0.50 | 11.0 | — |
| III | A | Comp. 1 | 365° C., 5 min. | 0.48 | 11.3 | — |
| IV | A | Comp. 2 | 440° C., 5 min. | 0.55 | 11.0 | — |
| V | B | Comp. 3 | 455° C., 5 min. | 0.62 | 10.7 | — |
| VI | C | Examp. 1 | 356° C., 5 min. | 0.45 | 12.6 | 0/20 |
| VII | D | Examp. 2 | 285° C., 5 min. | 0.44 | 12.7 | 0/20 |
| VIII | D | Examp. 3 | 250° C., 5 min. | 0.46 | 12.5 | 0/20 |
| IX | D | Examp. 4 | 225° C., 5 min. | 0.48 | 12.0 | 0/20 |
| X | D | Prior Art 3 | None | 0.49 | 11.4 | — |

In Table 2, the evaluation Nos. VI, VII, VIII, and IX, which correspond respectively to the examples 1, 2, 3, and 4 of the present invention, denote the test results obtained by using the fabrication method (FIGS. 5A to 5F) according to the first embodiment of the present invention, respectively.

In the evaluation No. VI (i.e., example 1), the vaporization process of the paraffin wax was carried out by using the type C of paraffin wax and heating at 365° C. for 5 minutes The temperature of 365° C. was equal to the vaporization finishing temperature of the wax type C and was lower than the performance degradation temperature of the chip 5.

In the evaluation No. VII (i.e., example 2), the vaporization process of the paraffin wax was carried out by using the type D of paraffin wax and heating at 285° C. for 5 minutes. The temperature of 285° C. was equal to the vaporization finishing temperature of the wax type D and was lower than the performance degradation temperature of the chip 5.

In the evaluation No. VIII (i.e., example 3), the vaporization process of the paraffin wax was carried out by using the type D of paraffin wax and heating at 250° C. for 5 minutes. The temperature of 250° C. was lower than the vaporization finishing temperature of the wax type D and the performance degradation temperature of the chip 5.

In the evaluation No. IX (i.e., example 4), the vaporization process of the paraffin wax was carried out by using the type D of paraffin wax and heating at 225° C. for 5 minutes. The temperature of 225° C. was lower than the vaporization finishing temperature of the wax type D and the performance degradation temperature of the chip 5.

The evaluation No. I denotes the test result obtained by using the prior-art package structure shown in FIGS. 1 and 2, where the vaporization process in Table 2 was not performed.

The evaluation Nos. II and X denote the test results obtained by using the prior-art package structure disclosed in the Japanese Examined Patent Publication No. 45-22384, respectively, where the vaporization process in Table 2 was not performed.

The evaluation No. III, which corresponds to the comparative example 1 of the present invention, denotes the test result obtained by using the type A of paraffin wax. In this case, the vaporization process in Table 2 was carried out at a temperature of 365° C. for 5 minutes. The temperature of 365° C. was a temperature at which the chip 5 was not damaged or degraded.

The evaluation No. IV, which corresponds to the comparative example 2 of the present invention, denotes the test result obtained by using the type A of paraffin wax. In this case, the vaporization process in Table 2 was carried out at a temperature of 440° C. for 5 minutes. The temperature of 440° C. was equal to the vaporization finishing temperature of the wax type A.

The evaluation No. V, which corresponds to the comparative example 3 of the present invention, denotes the test result obtained by using the type B of paraffin wax. In this case, the vaporization process in Table 2 was carried out at a temperature of 455° C. for 5 minutes. The temperature of 455° C. was equal to the vaporization finishing temperature of the wax type B.

Each of the results of the NF and Ga tests in Table 2 means the average value obtained by averaging the values of 20 samples. The result of the PCT in Table 2 means the ratio of the failure sample numbers with respect to the total sample number of 20, where the term "failure" means a sample at least one of the NF and Ga values of which deviates over 5% of its initial values.

As seen from Table 2, in the evaluation No. I, the samples had a low NF value and a high Ga value and therefore, they had good high-frequency characteristics. However, it is seen from the PCT result that the reliability was degraded due to the large characteristic deviation. This is due to the fact that (i) the cap 107 and the supporting member 102 were joined together by heating and curing a thermosetting epoxy resin, and that (ii) penetrating holes were formed in this thermosetting epoxy resin due to expansion and shrinkage of the air or nitrogen existing in the cavity 108 and therefore, the moisture vapor applied in the PCT entered the cavity 108 through the penetrating holes thus formed due to temperature change.

If the supporting member 102 and the cap 107 becomes thinner to 0.3 to 0.1 mm according to the device miniaturization and light-weighting, the moisture and an impurity are likely to enter the cavity 108 through the supporting member 102 and the cap 107 themselves, or the defects occurring in the adhesive material for joining the member 102 and the cap 107, in spite of elimination of the micro pores in the member 107 and the cap 102.

In the evaluation Nos. II and X, the samples had a high NF value and a low Ga value and therefore, they had bad high-frequency characteristics compared with the evaluation No. I. According to the inventor's test, it was found that this was due to the residue of the paraffin wax left at the surface recesses of the semiconductor element chip near its bonding pads. The NF and Ga characteristics of the semiconductor devices were degraded by the dielectric characteristic of the paraffin wax residue.

In the evaluation Nos. IV and V, similar to the evaluation Nos. II and X, the samples had a high NF value and a low Ga value. According to the inventor's test, it was found that this was due to the fact that the chip was destroyed or damaged by the heating process at the temperature of 440 or 450° C. which was higher than the performance degradation temperature (380° C.) of the chip.

In the evaluation No. III, since the vaporization process of the type A of paraffin wax was carried out at a temperature of 365° C. which was lower than the performance degradation temperature (380° C.) of the chip, the chip was not destroyed or damaged by the heating process at the temperature of 365° C. However, the NF and Ga characteristics of the samples were degraded.

On the other hand, in the evaluation Nos. VI, VII, VIII, and VI corresponding to the examples 1, 2, 3, and 4 of the present invention, since the vaporization process of the paraffin wax was carried out by using the paraffin wax whose vaporization finishing temperatures (365, 285, 250, and 225° C.) were lower than the performance degradation temperature (380° C.) of the chip, the samples had approximately the same NF and Ga characteristics as those obtained in the evaluation No. I. Also, the deviation of the NF and Ga characteristics was small in the PCT and therefore, the samples had satisfactorily good reliability.

The characteristic improvement in the PCT was caused by not only the fact that the paraffin wax itself has a hydrophobic property but also the fact that the vapor of the paraffin wax entered the micro pores and minute defects existing in the epoxy resin used for the supporting member 2 and the cover 7 and closed them. Due to the closing of the micro pores and minute defects, the air-tight characteristic of the supporting member 2 and the cover 7 was improved and accordingly, the moisture and any other impurity were able to be prevented from entering the cavity 8.

Additionally, the paraffin wax was melted due to heat and coated onto the surface of the chip 5 to form the paraffin wax layer 11 and then, the liquid packaging epoxy resin is applied to the paraffin wax layer 11 thus formed by a dropping or screen printing method. Further, the paraffin wax was vaporized to penetrate into the micro pores of the cover 7. Accordingly, not only the contour of the cover 7 but also the shape of the cavity 8 were able to be formed at the desired position, which contributes to further miniaturization of the semiconductor device 1. Since no plastic cap was necessary, there was an additional advantage that the fabrication cost was lowered.

In Table 2, the symbol "—" existing in the column of the PCT result means that the PCT was not performed for the corresponding evaluation Nos.

Second Embodiment

Figure 6:
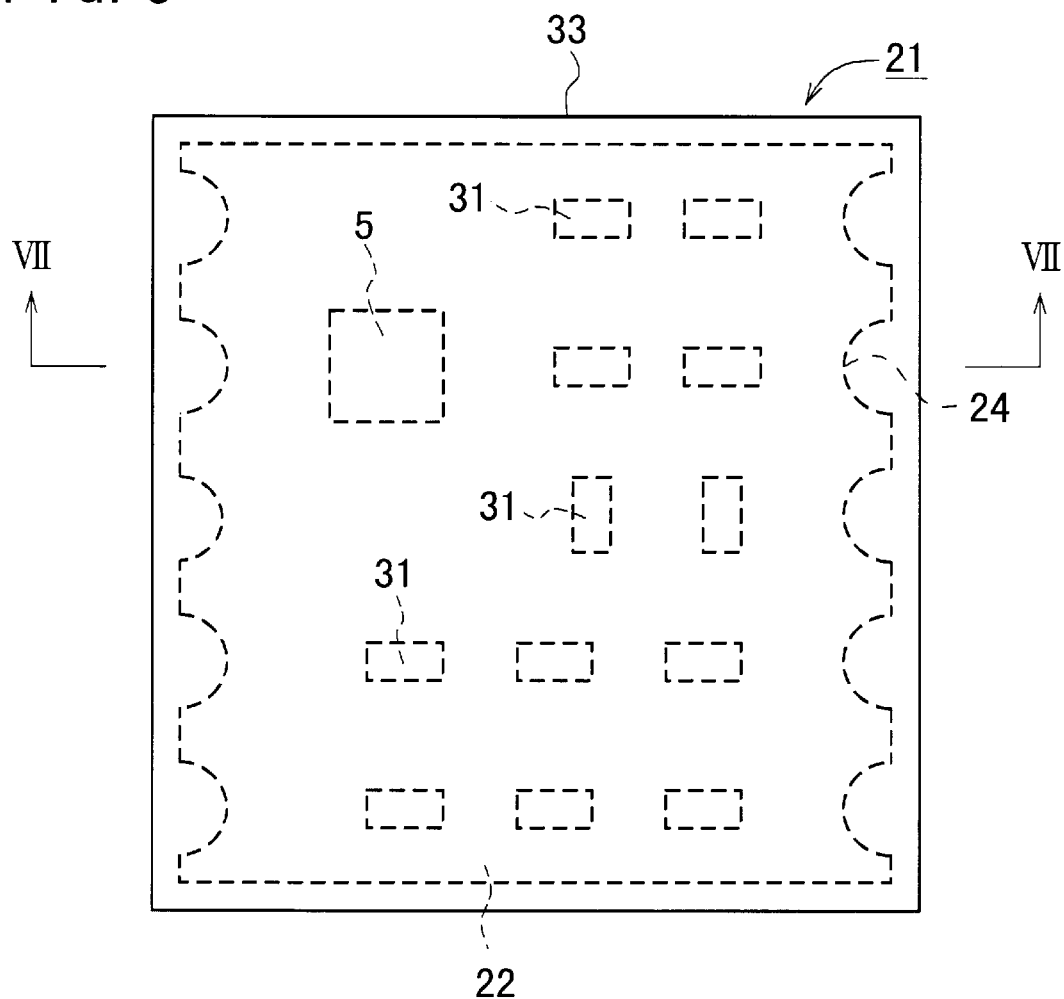
FIG. 6 is a schematic plan view showing the structure of a semiconductor device equipped with a substrate fabricated by a method according to a second embodiment of the present invention.
Figure 7:
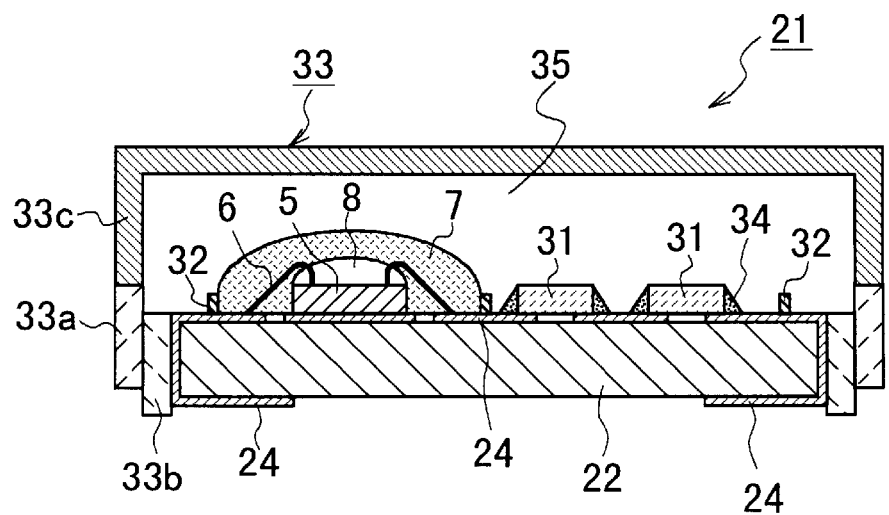
FIG. 7 is a cross-sectional view of the semiconductor device, which is along the line VII—VII in FIG. 6.

FIGS. 6 and 7 show a plastic-packaged semiconductor device fabricated by a method according to a second embodiment of the present invention.

In FIGS. 6 and 7, a semiconductor device 21 is comprised of a rectangular substrate 22 made of a synthetic resin such as glass epoxy or a ceramic such as alumina. A specific conductive pattern 24 is formed on the upper surface of the substrate 22 to constitute desired circuits. The conductive pattern 24 extends to the lower surface of the substrate 22 through its side faces. The parts of the pattern 24 located on the lower surface serve as terminals for electrically connecting the semiconductor device 21 to a desired outer circuit.

A microwave semiconductor element chip or IC chip 5 is fixed onto a specific location of the conductive pattern 24 by the use of a suitable adhesive material such as an Au/Sn alloy or Ag paste. Bonding pads (not shown), which are arranged at intervals on the surface of the chip 5, are electrically connected to the corresponding locations of the pattern 24 through bonding wires 6 made of Au or Al/Si alloy.

The IC chip 5 and the bonding wires 6 are covered with a plastic cover 7 made of a thermosetting epoxy resin, thereby sealing the chip 5 and the wires 6 from the outside of the cover 7. The bottom of the cover 7 is contacted with the surface of the substrate 22. The cover 7 has an approximately hemispherical shape. To match the thermal expansion coefficient of the thermosetting epoxy resin used for the cover 7 to the thermal expansion coefficient of the conductive pattern 24, a suitable amount of a powder of ceramic such as silica is added to the epoxy resin.

As shown in FIG. 7, a hollow cavity 8 is formed between the chip 5 and the cover 7 in the vicinity of the bonding pads of the chip 5. The cavity 8 has an approximately rectangular plan shape, which corresponds to the rectangular plan shape of the chip 5. The cavity 8 is formed by forming a paraffin wax layer (not shown in FIG. 7) on the surface of the chip 5 and then, removing the paraffin wax layer after the formation of the epoxy resin cover 7.

The cover 7 constitutes a plastic package of the semiconductor device 21.

Although not shown, the surfaces of the specific locations of the conductive pattern 24 are plated with a metal such as Au or Ni. The plated metal is formed for the purpose of (i) facilitating the adhesion or fixing of the IC chip 5 to the pattern 24, and (ii) bonding the bonding wires 6 to the pattern 24.

Various chip-type electronic components 31 such as capacitors, resistors, and so on are fixed onto the conductive pattern 24 by the use of a conductive bonding material 34 such as a Pb/Sn solder, an Au/Sn alloy, or a Ag paste. To prevent the liquid epoxy resin for the plastic cover 7 (i.e., the packaging epoxy resin) and the bonding material 34 from expanding excessively and to improve the bonding property of the bonding wires 6, small dams or barriers 32 are formed on the specific locations of the conductive pattern 24. Due to the action of the dams 32, the stopping action of the molten epoxy resin for the cover 7 is ensured. Therefore, there is an additional advantage that the shape of the cover 7 is stably determined.

A metal lid 33 is fixed to the substrate 22 by the use of a brazing material such as a Pb/Sn alloy. A body 33c of the lid 33 defines and seals an upper space 35 of the substrate 22. The lid 33, which is made of a copper-system alloy or a Fe/Ni alloy, has a rectangular box-like shape whose bottom is open. According to the shape of the opening bottom of the lid 33 (i.e., the bottom shape of the body 33c of the lid 33), mounting or fixing members 33a and 33b of the lid 33 are formed to have rectangular-ring shapes that surround the whole contour of the substrate 22. The inner faces of the members 33b are fixed to the side faces of the substrate 22 by a brazing material (not shown). The IC chip 5, the bonding wires 6, the plastic cover 7, and the chip-type components 31 are located in the upper space 35.

The lid 33 serves to prevent the external electromagnetic waves from entering the space 35 and to prevent the internal electromagnetic waves occurring in the semiconductor device 21 from affecting the performance of the device 21.

Next, a fabrication method of the semiconductor device 21 with the configuration shown in FIGS. 6 and 7 is explained below with reference to FIGS. 8A to 8G.

Figure 8A:
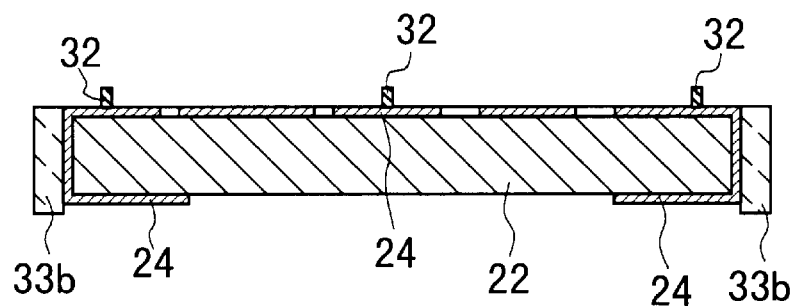
FIGS. 8A to 8G are cross-sectional views showing the process steps of the fabrication method according to the second embodiment of the present invention, respectively.
Figure 8B:
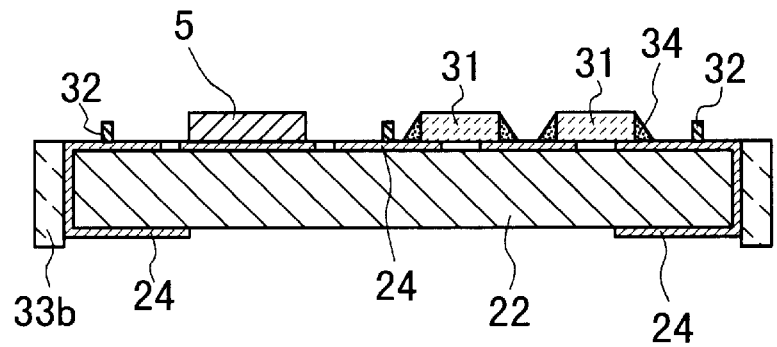

First, the substrate 22 with the configuration shown in FIGS. 6 and 7 is prepared. As shown in FIG. 8A, the substrate 22 has the conductive pattern 24, the dams 32 formed on the specific locations of the pattern 24, and the mounting member 33b fixed to the four side faces of the substrate 22.

Next, as shown in FIG. 82, the IC chip 5 and the chip-type components 31 are fixed to the corresponding locations of the conductive pattern 24 using the bonding material such as a Pb/Sn solder, Au/Sn alloy, or Ag paste.

Figure 8C:
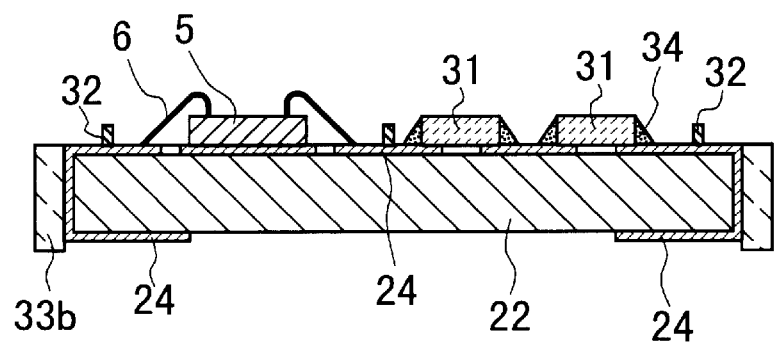

Thereafter, as shown in FIG. 8C, the bonding pads of the IC chip 5 and the specific locations of the conductive pattern 24 are electrically connected through the bonding wires 6 by a known wire bonding method.

Figure 8D:
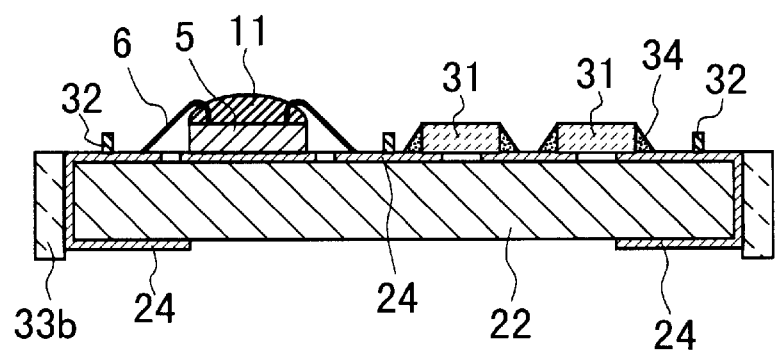

Then, as shown in FIG. 8D, a paraffin wax layer 11 is selectively formed on the surface of the IC chip 5 fixed onto the substrate 22. The shape and size of the paraffin wax layer 11 are designed to be equal to those of the hollow cavity 8 to be formed in the cover 7. The paraffin wax, which is solid at room temperature (15° C.), is melted or fluidized by heating to a temperature slightly higher than the melting point of the paraffin wax (a first heating process). It is preferred that this heating temperature is higher than the melting point of the paraffin wax by approximately 10 to 30 degrees in centigrade. The paraffin wax thus fluidized is then coated onto the surface of the IC chip 5. The coated paraffin wax is cooled to room temperature and cured by a natural cooling method, resulting in the paraffin wax layer 11.

Figure 8E:
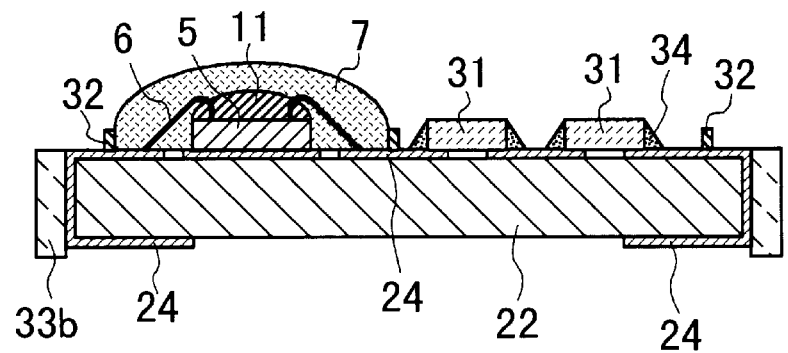
Figure 8F:
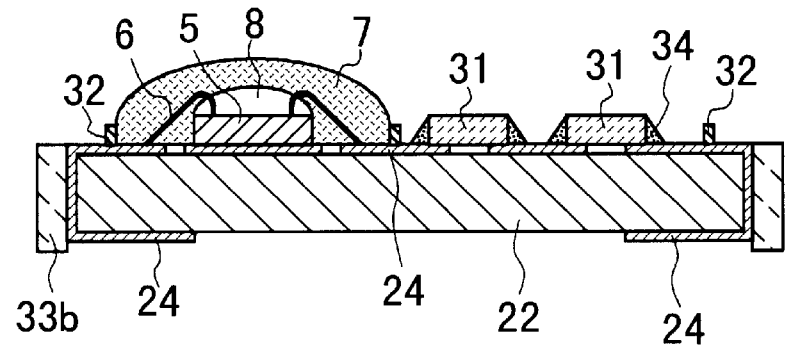
Figure 8G:
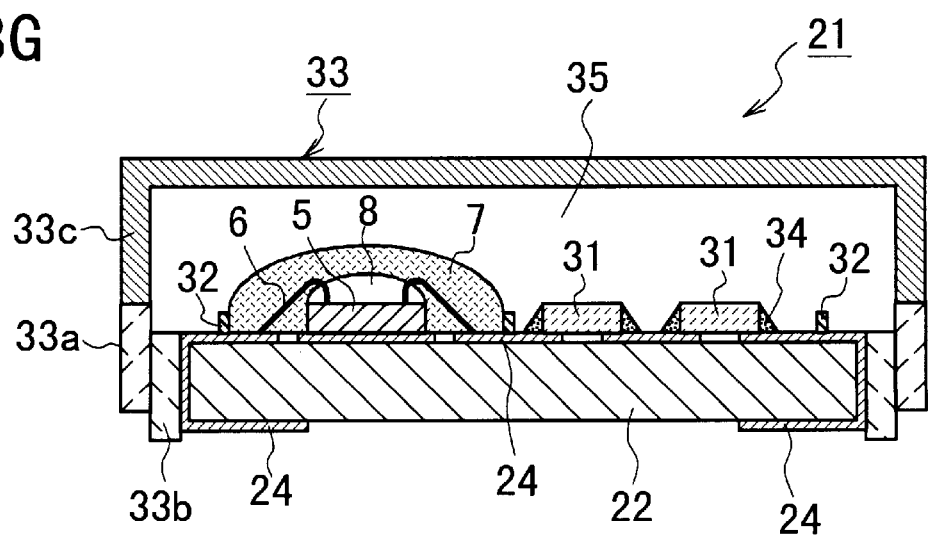

Thereafter, to form the plastic cover 7 on the upper surface of the substrate 22, a thermosetting epoxy resin which is liquid at room temperature is used. Specifically, a specific amount of a liquid epoxy resin is placed onto the upper surface of the substrate 22 at room temperature so as to cover the whole upper surface of the chip 5 by a dropping method, a screen printing method, or the like. The state at this stage is shown in FIG. 8E. The chip 5 and the bonding wires 6 are covered with the liquid epoxy resin thus placed.

The epoxy resin used for the plastic cover 7, which is liquid at room temperature, is produced by dissolving a suitable thermosetting epoxy resin in a suitable solvent such as methyl ethyl ketone. For the purpose of matching the thermal expansion coefficients, the thermosetting epoxy resin contains a suitable amount of a powder of ceramic such as silica ($SiO_2$).

Further, the subassembly of the semiconductor device 21 having the liquid epoxy resin on the substrate 22 is reheated to a temperature which is equal to or higher than the cure starting temperature of the thermosetting epoxy resin and which is higher than the melting point of the paraffin wax layer 11 (a second heating process). For example, this temperature is set as 150° C., because of the same reason as that in the first embodiment.

During this second heating process, the liquid epoxy resin placed on the substrate 22 is cured, thereby forming the plastic cover 7 with the shape as shown in FIGS. 6 and 7. At the same time as this, the paraffin wax of the paraffin wax layer 11 is melted and then, the melted wax penetrates into the micro pores produced in the epoxy resin cover 7 due to the capillarity phenomenon. In other words, the plastic cover 7 is turned to a state where the pores of the cover 7 are impregnated with the molten paraffin wax. As a result, through this heating process, almost all the paraffin wax layer 11 disappears and almost all the micro pores of the cover 7 are filled or closed with the molten paraffin wax.

All the paraffin wax layer 11 does not disappear in the second heating process. A slight part of the paraffin wax layer 11 is left as a residue at the minute recesses of the surface of the IC chip 5 near the bonding pads and/or the inner wall or the cover 7.

Thereafter, the subassembly of the semiconductor device 21 with the epoxy resin cover 7 is reheated to a temperature (for example, 250° C.) which is equal to or higher than the vaporization starting temperature of the paraffin wax of the paraffin wax layer 11. Through this process, the residue of the remaining paraffin wax at the minute surface recesses of the IC chip 5 near the bonding pads and/or the inner wall of the cover 7 is removed substantially completely. Thus, the hollow cavity 8 having the same shape and size as those of the paraffin wax layer 11 is formed between the chip 5 and the cover 7.

The vapor of the paraffin wax residue is discharged to the outside of the cavity 8 through the remaining unfilled or unclosed micro pores of the plastic cover 7. These unfilled or unclosed micro pores are closed by the paraffin wax residue thus discharged.

Finally, by known cutting and forming methods, the mounting member 33a of the lid 33 are fixed to the mounting member 33b that has been fixed to the side faces of the substrate 22. Thus, the semiconductor device 21 with the configuration shown in FIGS. 6 and 7, which has the plastic package formed by the plastic cover 7 alone, is fabricated.

With the fabrication method of a semiconductor device according to the second embodiment of the present invention, since substantially the same process steps as those in the first embodiment are carried out, it is obvious that there are the same advantages as those in the first embodiment.

In the first and second embodiments, the plastic package is formed by the plastic cover 7 located on the plastic supporting member 2 or the plastic or ceramic substrate 22. However, the plastic package may be formed to encapsulate the entire semiconductor element chip 5. In other words, the supporting member 2 and the cover 7 shown in FIGS. 3 and 4 may be replaced with a single plastic package encapsulating entirely the semiconductor element chip 5 and its neighboring parts.

While the preferred embodiments of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, comprising:

a first step of melting a wax with a property of being solid at room temperature due to heat and coating said melted wax to cover bonding terminals of an IC chip, thereby forming a wax layer at a location where a cavity of a plastic package is formed, a second step of covering said wax layer and said IC chip with a thermosetting resin dissolved in a solvent;

a third step of curing said coated thermosetting resin to form a plastic package and melting said wax layer to penetrate into said plastic package due to application of heat at a first temperature, thereby forming said cavity inside said plastic package at said location where said wax layer has been formed; and a fourth step of vaporizing a residue of said wax layer left in said cavity due to application of heat at a second temperature, thereby removing said residue from said cavity.

2. The method as claimed in claim 1, wherein micro pores are produced in said liquid-like thermosetting plastic package due to vaporization of said solvent contained therein in said third step;

and wherein said melted wax layer is discharged from said cavity through said micro pores of said package in said third step.

3. The method as claimed in claim 2, wherein almost all said micro pores of said plastic package are closed by said melted wax layer in said third step;

and wherein said remaining unclosed micro pores of said plastic package are closed by said residue of said wax layer in said fourth step.

4. The method as claimed in claim 1, wherein said solvent of said liquid-like thermosetting packaging resin has a content of 5.0 to 1.0 wt %.

5. The method as claimed in claim 1, wherein said first temperature is higher than a temperature at which said liquid-like thermosetting packaging resin starts to cure and higher than a melting point of said wax layer.

6. The method as claimed in claim 1, wherein said second temperature is higher than a temperature at which at least 95 wt % of said wax layer left in said cavity is vaporized and lower than a temperature at which characteristics of said chip start to degrade.

7. The method as claimed in claim 1, wherein said semiconductor device is comprised of a plastic supporting member that supports a die pad and lead fingers;

and wherein said chip is mounted onto said die pad and electrically connected to said lead fingers prior to said first step, and packaging resin is fixed onto said supporting member to cover said chip in said second step.

8. The method as claimed in claim 1, wherein said semiconductor device is comprised of a substrate having a conductive pattern on its surface;

and wherein said chip is mounted onto said substrate and electrically connected to said conductive pattern prior to said first step, and said packaging resin is fixed onto said substrate to cover said chip in said second step.

9. The method as claimed in claim 1, wherein a paraffin wax is used as said wax.

10. The method as claimed in claim 1, wherein at least one of said first and second temperatures is adjusted by changing an average molecular weight of said wax.

11. The method as claimed in claim 1, wherein said second temperature is not greater than a thermal decomposition temperature of said packaging resin or said supporting member;

and wherein said second temperature is not greater than a performance degradation temperature of said chip.

\* \* \* \* \*